US010186855B2

(12) United States Patent
von Sebo et al.

(10) Patent No.: US 10,186,855 B2
(45) Date of Patent: Jan. 22, 2019

(54) DIFFERENTIAL FAULT DETECTION SYSTEM

(71) Applicant: ABB Schweiz AG, Baden (SE)

(72) Inventors: Joseph von Sebo, New Berlin, WI (US); Peter M. Stipan, Wind Lake, WI (US); David R. Holmburg, Waukesha, WI (US)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/285,112

(22) Filed: Oct. 4, 2016

(65) Prior Publication Data
US 2018/0097353 A1    Apr. 5, 2018

(51) Int. Cl.
G01R 31/02    (2006.01)
H02H 7/12     (2006.01)
H02M 5/42     (2006.01)
H02P 27/04    (2016.01)
G01R 31/42    (2006.01)

(52) U.S. Cl.
CPC .......... H02H 7/1216 (2013.01); G01R 31/42 (2013.01); H02M 5/42 (2013.01); H02P 27/04 (2013.01); G01R 31/025 (2013.01)

(58) Field of Classification Search
CPC ... H02M 2007/53876; H02M 7/53875; H02M 2001/0009; H02M 5/458; H02M 7/5395
See application file for complete search history.

(56) References Cited

U.S. PATENT DOCUMENTS 6,320,731 B1    11/2001 Eaves et al.
2010/0079009 A1 4/2010 Kitanaka
2010/0079093 A1 4/2010 Kitanaka
(Continued)

FOREIGN PATENT DOCUMENTS

JP    2013038917    2/2013

OTHER PUBLICATIONS

European Examination Report; European Patent Office; European Patent Application No. 17194698.1; dated Feb. 13, 2018; 8 pages.
(Continued)

Primary Examiner — Shawki S Ismail
Assistant Examiner — Zoheb Imtiaz
(74) Attorney, Agent, or Firm — J Bruce Schelkopf; Taft Stettinius & Hollister LLP

(57) ABSTRACT

Unique systems, methods, techniques and apparatuses of a fault detection system are disclosed herein. One exemplary embodiment is a fault detection system comprising a protected device including a DC bus structured to receive AC power and provide AC power; a DC bus sensor structured to measure an electrical characteristic of the DC bus; at least one input sensor structured to measure an electrical characteristic of the AC power received by the protected device; at least one output sensor structured to measure the electrical characteristic of the AC power provided by the protected device; and a monitoring device configured to receive measurements from the DC bus sensor, at least one input sensor, at least one output sensor and determine the existence of a fault condition which originates within the protected device using the measurements of the DC bus sensor, at least one input sensor, and at least one output sensor.

17 Claims, 2 Drawing Sheets

(56) References Cited

U.S. PATENT DOCUMENTS

| | | | |
|---|---|---|---|
| 2012/0275196 A1* | 11/2012 | Chapman | H02J 3/383 |
| | | | 363/17 |
| 2013/0322133 A1 | 12/2013 | Li | |
| 2014/0117910 A1 | 5/2014 | Le et al. | |
| 2015/0346255 A1 | 12/2015 | Wagner | |
| 2017/0093298 A1* | 3/2017 | Simms | H02M 1/32 |

OTHER PUBLICATIONS

Endrejat, Frieder et al. Ensuring Availability of a Large Adjustable Speed Drive For Process Gas Compressor Application Rated 11kv, 15.5 MW (20778 hp), IEEE, Jun. 9, 2009, 8 pgs.

* cited by examiner

DIFFERENTIAL FAULT DETECTION SYSTEM

BACKGROUND

The present disclosure relates generally to a fault detection system. Fault detection systems protect power electronics from faults conditions caused by power source disruptions, poor power quality of incoming power, and power electronic component failure. Existing fault detection systems suffer from a number of shortcomings and disadvantages. There remain unmet needs including improving response time, reducing system complexity, and increasing sensitivity and selectivity to faults. For instance, certain fault detection systems protecting motor drives with an input transformer require numerous sensors on the primary winding and secondary windings of the transformer. Detecting a fault requires inputs from each of the sensors, which increase costs and complexity of the detection scheme. Therefore, there is a significant need for the unique apparatuses, methods, systems and techniques disclosed herein.

DISCLOSURE OF ILLUSTRATIVE EMBODIMENTS

For the purposes of clearly, concisely and exactly describing non-limiting exemplary embodiments of the disclosure, the manner and process of making and using the same, and to enable the practice, making and use of the same, reference will now be made to certain exemplary embodiments, including those illustrated in the figures, and specific language will be used to describe the same. It shall nevertheless be understood that no limitation of the scope of the present disclosure is thereby created, and that the present disclosure includes and protects such alterations, modifications, and further applications of the exemplary embodiments as would occur to one skilled in the art with the benefit of the present disclosure.

SUMMARY

Exemplary embodiments include unique systems, methods, techniques and apparatuses for fault detection systems. Further embodiments, forms, objects, features, advantages, aspects and benefits of the disclosure shall become apparent from the following description and drawings.

DETAILED DESCRIPTION OF ILLUSTRATIVE EMBODIMENTS

Figure 1:
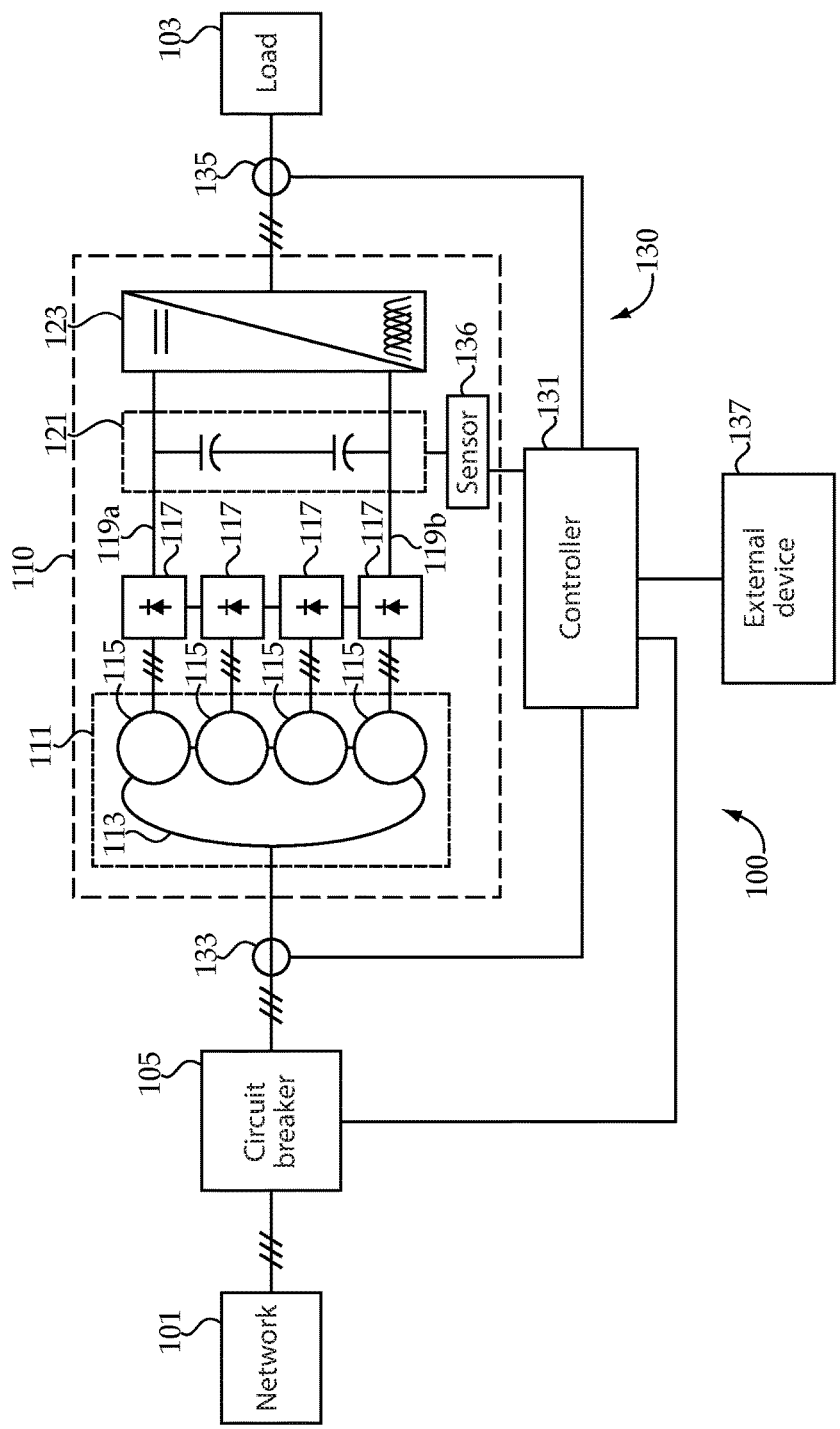
FIG. 1 illustrates an exemplary fault detection system.

With reference to FIG. 1 there is illustrated an exemplary power system 100 including a protected device 110 and a fault detection system 130. In the illustrated embodiment, device 110 is a medium voltage drive. It shall be appreciated that system 100 may be implemented in a variety of applications, including low voltage drive applications, high voltage drive applications, and AC/AC power converters to name but a few examples.

System 100 includes a power source 101. In the illustrated embodiment, power source 101 is a power network, such as a utility grid. In other embodiments, power source 101 is a generator, a wind turbine, a DC power source coupled to an inverter or any other power source structured to output alternating current (AC) power. In the illustrated embodiment, power source 101 provides three phase AC power. In certain embodiments power source 101 outputs single phase AC power. In other embodiments, power source 101 provides another type of multiphase AC power.

Power source 101 is coupled to an interrupting (protective) device 105. In the illustrated embodiment, device 105 is a circuit breaker. In other embodiments, device 105 is a switch, a relay, or any other type of device structured to disrupt the flow of current from power source 101.

Protected device 110 is coupled to protective device 105. In the illustrated embodiment, device 110 is a medium voltage drive including a transformer 111, a plurality of rectifiers 117, a DC link 121, and an inverter 123. Transformer 111 includes a primary winding 113 and four secondary windings 115. In certain embodiments, the number of secondary windings 115 may be greater or less than the number of secondary windings 115 illustrated in FIG. 1. Transformer 111 is structured to receive AC power from power source 101 with primary winding 113, to step up or step down the voltage of the received AC power, and to output the modified AC power with the plurality of secondary windings 115. In the illustrated embodiment, each secondary winding 115 is structured to output three phase power.

Each secondary winding 115 is coupled to one of the plurality of rectifiers 117 structured to receive AC power from one of the plurality of secondary windings 115, convert the AC power to DC power, and output the DC power. The plurality of rectifiers 117 are coupled together in series. In the illustrated embodiment, each of the plurality of rectifiers 117 include passive components, such as diodes. In other embodiments, one or more of the plurality of rectifiers 117 include active components, such as semiconductor switches.

Two of the plurality of rectifiers 117 are coupled to a DC bus including a first bus 119a and a second bus 119b and structured to receive the converted DC power from the plurality of rectifiers 117. DC link 121 is coupled between bus 119a and bus 119b. In the illustrated embodiment, DC link 121 includes two capacitors coupled in series. In other embodiments DC link 121 includes one or more capacitors coupled in series.

Inverter 123 is coupled to bus 119a and bus 119b and is structured to receive DC power, convert the DC power to three phase AC power, and output the AC power. In other embodiments, inverter 123 is structured to output single phase AC power or another type of multiphase AC power. A load 103 is coupled to inverter 123 and structured to receive the converted AC power from inverter 123. In the illustrated embodiment, load 103 is a motor structured to receive medium voltage power. In other embodiments, load 103 is any device or system structured to receive AC power.

Fault detection system 130 includes a first set of sensors 133 structured to measure electrical characteristics of the AC power transmitted from power source 101 to transformer 111. Fault detection system 130 also includes a second set of sensors 135 structured to measure electrical characteristics of the AC power transmitted from protected device 110 to load 103. Where load 103 is an electric machine with windings coupled in a wye connection, each sensor of sensor set 135 may be coupled between the end of the winding and the neutral point. Each sensor set 133 and 135 includes one sensor for each phase. Sensor sets 133 and 135 may be current sensors structured to measure the electrical current. In certain embodiments, sensor set 133 and 135 are structured to measure electrical characteristics which are used to calculate electrical current. In certain embodiments, sensors 133 and 135 are structured to measure active or reactive current components.

Fault detection system 130 also includes a DC bus sensor 136 structured to measure electrical characteristics of DC link 121. In certain embodiments, sensor 136 is structured to measure the DC bus voltage across the DC link 121.

Fault detection system 130 includes a controller 131 structured to receive information, such as data or a signal, from sensor sets 133 and 135, as well as sensor 136, and use the information received from the sensors to determine whether a fault condition is occurring within protected device 110. For example, controller 131 may detect current imbalance, a transformer 111 malfunction, a rectifier 117 malfunction, a ground fault, a single phase fault, a multiple phase fault, and a ride through condition.

Controller 131 is configured to use information from DC bus sensor 136 to scale either information from sensor set 133 or sensor set 135 in order to determine whether a fault condition is occurring in system 100. The concept of fault detection can be illustrated with the following example. Suppose load 103 is an electric motor requiring 1 MW of power with a nominal voltage of 4,000 V and a power factor of 0.85. Power source 101 transmits power to protected device 110 with a nominal voltage of 13,800 V, DC link capacitors have a nominal voltage of 6,000 V, and system 100 is 95% efficient. A loss constant of 0.2 ohm represents the expected losses of system 100. The required input power can be determined with the following formula where $P_{Nominput}$ is input power received by protected device 110 from power source 101, $P_{load}$ is the power output by protected device 110 to load 103, and $\eta_{total}$ is system efficiency:

$$P_{Nominput} = \frac{P_{load}}{\eta_{total}} \tag{1}$$

Using equation (1), the nominal power to be received by protected device 110 is 1.053 MW.

Load current can be calculated using the following formula, where $i_{Nomload}$ is nominal current output by protected device 110 to load 103 and $V_{Nomload}$ is the nominal voltage of the power output by protected device 110 to load 103:

$$i_{Nomload} = \frac{P_{load}}{\sqrt{3} \times V_{Nomload}} \tag{2}$$

Using equation (2), load current output from protected device 110 to load 103 is calculated to be 144.338 A.

Nominal input current can be calculated using the following formula, where $i_{Nominput}$ is nominal input current from power source 101 to protected device 110 and $V_{Nominput}$ is nominal input voltage of the power transmitted from power source 101 to device 110:

$$i_{Nominput} = \frac{P_{input}}{\sqrt{3} \times V_{Nominput}} \tag{3}$$

Using equation (3), nominal input current from power source 101 to protected device 110 is calculated to be 44.039 A.

In a first scenario, sensor set 133 detects a current from power source 101 to protected device 110 of 42 A, sensor set 135 detects a current from protected device 110 to load 103 of 140 A, and DC bus sensor 136 detects a DC link capacitor voltage of 6,700 V. In order to determine whether a fault is occurring in system, controller 131 calculates a scaling factor using the measured DC bus voltage and expected DC bus voltage. Controller 131 calculates the expected DC bus voltage using the following formula, where $V_{DCexp}$ is the expected DC bus voltage value, $V_{NomDC}$ is the nominal DC bus voltage, $i_{1input}$ is the current measured with sensor set 133, and $k_{DC}$ is the loss constant:

$$V_{DCexp} = V_{NomDC} + (i_{Nominput} + i_{1input}) \times k_{DC} \tag{4}$$

Using equation (4), expected DC bus voltage is calculated to be approximately 6.6 kV.

The scaling factor can be calculated with the following formula, where $k_1$ is the scaling factor and $V_{1DC}$ is the voltage measured with sensor 136:

$$k_1 = \frac{V_{1DC}}{V_{DCexp}} \tag{5}$$

Using equation (5), the scaling factor $k_1$ is calculated to be 1.015.

Using the following set of equations, the difference of power received with protected device 110 and output with device 110 is calculated, where $P_{1input}$ is calculated input power, $P_{1out}$ is the calculated output power, and $P_{diff}$ is power percentage difference:

$$P_{1input} = \sqrt{3} \times i_{1input} \times V_{1DC} \times k_1 \tag{6}$$
$$P_{1out} = \sqrt{3} \times i_{1load} \times V_{Nomload}$$
$$P_{diff} = \frac{|P_{1input} \times \eta_{total} - P_{1out}|}{P_{1out}}$$

Using equation set (6), calculated input power $P_{1input}$ is calculated to be 1.019 MW, calculated output power $P_{1out}$ is calculated to be 0.97 MW, and the power percentage difference $P_{diff}$ is calculated to be 0.191%. Given the value of $P_{diff}$, controller 131 does not detect a fault.

In a second scenario, sensor set 133 detects a current from power source 101 to protected device 110 of 40 A, sensor set 135 detects a current from protected device 110 to load 103 of 50 A, and DC bus sensor 136 detects a DC link capacitor voltage of 6,700 V. Using equation (4), $V_{DCexp}$ is calculated to be approximately 6.6 kV. Using equation (5), $k_1$ is calculated to be 1.015. Using equation set (6), calculated input power $P_{1input}$ is calculated to be 0.97 MW, calculated output power $P_{1out}$ is calculated to be 0.346 MW, and the power percentage difference $P_{diff}$ is calculated to be 166.14%. Given the value of $P_{diff}$, controller 131 has detected a fault.

In the illustrated embodiment, controller 131 is coupled to protective device 105 and is structured to transmit an interrupt signal to device 105 in response to determining a fault is occurring in system 100 for a period of time. Controller 131 is also coupled to an external device 137 and is structured to transmit an alarm signal to device 137 in response to determining a fault is occurring in system 100 for a period of time. In certain embodiments, the period of time is one cycle. In certain embodiments, the period of time is determined by the severity of the fault. In certain embodiments, external device 137 is a SCADA network. In certain embodiments, controller 131 may be coupled to external device 137 or protective device 105. It shall be appreciated that any or all of the foregoing features of system 100 may also be present in the other fault detection systems disclosed herein.

Figure 2:
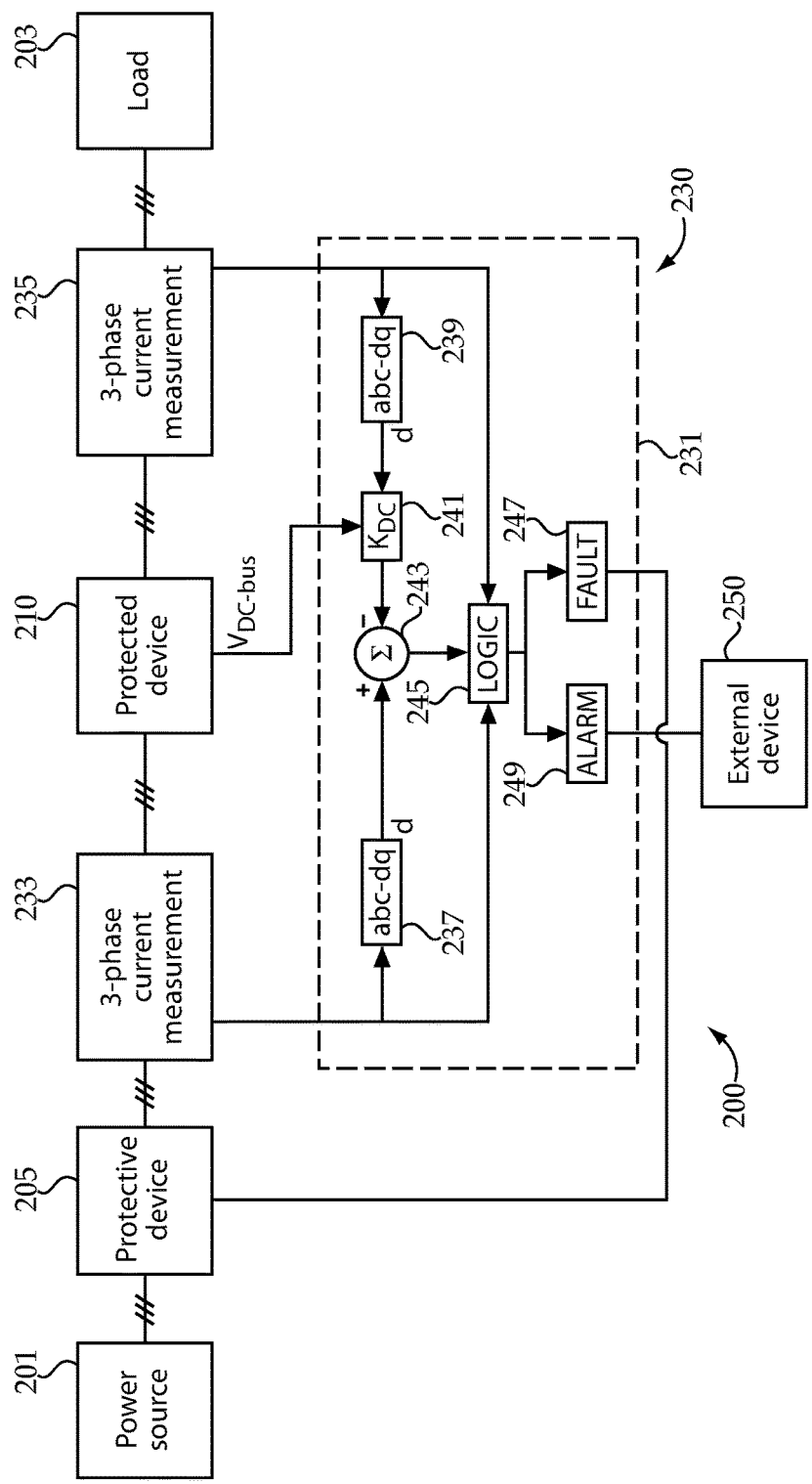
FIG. 2 illustrates another exemplary fault detection system.

With reference to FIG. 2 there is illustrated an exemplary fault detection system 200 including a monitoring system 230. Power source 201 is coupled to protective device 205 and structured to receive AC power from power source 201. Protected device 210 is coupled to protective device 205 and structured to receive AC power from device 205, convert the AC power to DC power, convert the DC power to AC power, and output the AC power. A load 203 is coupled to protected device 210 and structured to receive the AC power output by the device 210. Monitoring system 230 includes current measurement devices 233 and 235 structured to measure electrical characteristics of system 200 and output the electrical characteristic measurements to a controller 231. Protected device 210 includes a DC bus and a DC bus sensor of monitoring system 230 structured to measure electrical characteristics of the DC bus and output the electrical characteristic measurements to controller 231.

Controller 231 includes variable transformation modules 237 and 239, a scaling module 241, subtraction module 243, a logic module 245, an alarm module 249, and a fault module 247. Variable transformation module 237 is structured to receive measurements from device 233, transform the measurements from a rotating reference frame to a stationary reference frame, and output the transformed measurements to subtraction module 243. Transformation module 239 is structured to receive measurements from device 235, transform the measurements from a rotating reference frame to a stationary reference frame, and output the transformed measurements to scaling module 241. Scaling module 241 is structured to receive the transformed measurements from module 239 as well as the DC bus measurement from protected device 210, and scale the received transformed measurement using the DC bus measurement received from protected device 210. Scaling module 241 is then configured to output the scaled transformed measurement to subtraction module 243. Subtraction module 243 is configured to subtract the output of module 241 from the output of module 237 and transmit the result to logic module 245.

Logic module 245 is structured to receive measurements from devices 233 and 235, as well as the calculated value from subtraction module 243. Using the received values, logic module 245 determines whether a fault is occurring in system 200. If logic module determines a fault is occurring in system 200, alarm module 249 may communicate with an external device 137, such as a SCADA network, and a fault module 247 may communicate with protective device 205 structured to interrupt the current flowing from power source 201 to protected device 210.

Further written description of a number of exemplary embodiments shall now be provided. One embodiment is a fault detection system comprising: an AC/AC converter including a DC bus, the AC/AC converter structured to receive AC power and provide AC power; a DC bus sensor structured to measure an electrical characteristic of the DC bus; an input sensor structured to measure an electrical characteristic of the AC power received by the AC/AC converter; an output sensor structured to measure the electrical characteristic of the AC power provided by the AC/AC converter; and a monitoring device configured to receive measurement information from the DC bus sensor, the input sensor, the output sensor and to determine the existence of a fault condition within the AC/AC converter using an evaluation of one the measurement information one of the input sensor and the output sensor relative to the other of the input sensor and the output sensor in combination with the measurement information of the DC bus sensor.

In certain forms of the foregoing system, the input sensor measures the current of the AC power received by the AC/AC converter, the output sensor measures the active component of the AC power provided by the AC/AC converter, and the DC bus sensor measures the voltage across the DC bus. In certain forms, the monitoring device is configured to detect a fault by scaling one of the output sensor measurements and the input sensor measurements and comparing the scaled one of the output sensor measurements and the input sensor measurements with other of the output sensor measurements and the input sensor measurements. In certain forms, the magnitude of the scaling is determined using the DC bus sensor measurement. In certain forms, the AC/AC converter monitoring device is configured to detect a fault condition comprising one or more of a current imbalance, a short circuited subcomponent of the AC/AC converter, and an open circuit failure of a subcomponent of the AC/AC converter. In certain forms, the monitoring device is structured to transmit an interrupt signal to a protective device in response to determining the existence of a fault condition, the interrupt signal structured to instruct the protective device to interrupt the flow of AC power received with the AC/AC converter. In certain forms, the AC/AC converter is a variable speed drive including a transformer. In certain forms, the system comprises an electric motor having a plurality of stator windings coupled at a neutral point connection and the output sensor is structured to measure electric characteristics at the point of the neutral point connection.

Another exemplary embodiment is a monitoring system coupled to a power system including a protected device configured to receive AC power, convert the received AC power to DC power, convert the DC power to AC power, and output the converted AC power, the monitoring system comprising: a first sensor configured to measure the AC power received by the protected device; a second sensor configured to measure the AC power output by the protected device; a third sensor configured to measure the DC power; a monitoring device structured to receive measurements from the first sensor, the second sensor, and the third sensor, and configured to determine whether a fault is occurring within the protected device using an evaluation of one of the measurements from the first sensor relative to one of the measurements of the second sensor, in combination with one of the measurements of the third sensor.

In certain forms of the foregoing system, the AC power received with the protected device is multiphase AC power. In certain forms, the first sensor is configured to measure multiphase current of the AC power received with the protected device, the second sensor is configured to measure multiphase current of the AC power output by the protected device, and the third sensor is structured to measure the voltage of the DC power. In certain forms, the monitoring device is configured to determine a fault is occurring within the protected device by scaling one of the measurements of the first sensor and the measurements of the second sensor and comparing the scaled measurements of the first or second sensor with the measurements of the other sensor. In certain forms, the fault is one of a current imbalance, a short circuit condition within the protected device, a ground fault, a motor ride through condition, and an open circuit condition within the protected device. In certain forms, the system comprises a protective device structured to interrupt the flow of AC power to the protected device in response to determining a fault is occurring using the measurements from the first sensor, second sensor, and third sensor. In certain forms, the monitoring device is configured to transmit an alert message to a communication network in response to determining a fault is occurring using the measurements from the first sensor, second sensor, and third sensor.

A further exemplary embodiment is a method for protecting a device including a converter structured to receive AC power, convert the AC power to DC power, convert the DC power to AC power, and output the converted AC power, the method comprising: measuring the AC power received with the device; measuring the DC power; measuring the AC power output with the device; scaling either the measurement of AC power received with the device or the measurement of AC power output with the device using the DC power measurement; comparing the scaled one of the measurements of AC power received with the device and one of the measurements of AC power output with the device relative to the other one of the measurements of AC power received with the device and one of the measurement of AC power output with the device; and determining a fault condition is occurring within the device in response to comparing the measurement of AC power received with the device and the measurement of AC power output with the device.

In certain forms of the foregoing method, the AC power received with the device and the AC power output with the device is multiphase AC power, and comparing the measurement of AC power received with the device and the measurement of AC power output with the device including calculating the difference between the scaled measurement and the other measurement for each phase. In certain forms, the method comprises interrupting the flow of AC power to the device in response to determining a fault condition is occurring within the device. In certain forms, the device is a variable speed drive including a transformer and a converter. In certain forms, a fault condition includes a transformer phase failure or a passive rectifier short circuit condition.

It is contemplated that the various aspects, features, processes, and operations from the various embodiments may be used in any of the other embodiments unless expressly stated to the contrary. Certain operations illustrated may be implemented by a computer executing a computer program product on a non-transient computer readable storage medium, where the computer program product includes instructions causing the computer to execute one or more of the operations, or to issue commands to other devices to execute one or more operations.

While the present disclosure has been illustrated and described in detail in the drawings and foregoing description, the same is to be considered as illustrative and not restrictive in character, it being understood that only certain exemplary embodiments have been shown and described and that all changes and modifications that come within the spirit of the present disclosure are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the present disclosure, the scope being defined by the claims that follow. In reading the claims, it is intended that when words such as "a," "an," "at least one," or "at least one portion" are used there is no intention to limit the claim to only one item unless specifically stated to the contrary in the claim. The term "of" may connote an association with or a connection to another item as well as a belonging to or a connection with the other item as informed by the context in which it is used. The terms "coupled to," "coupled with" and the like include indirect connection and coupling and further include but do not require a direct coupling or connection unless expressly indicated to the contrary. When the language "at least a portion" and/or "a portion" is used the item can include a portion and/or the entire item unless specifically stated to the contrary.

What is claimed is:

1. A fault detection system comprising:
   an AC/AC converter including a DC bus, the AC/AC converter structured to receive AC power and provide AC power;
   a DC bus sensor structured to measure an electrical characteristic of the DC bus;
   an input sensor structured to measure an electrical characteristic of the AC power received by the AC/AC converter;
   an output sensor structured to measure the electrical characteristic of the AC power provided by the AC/AC converter; and
   a monitoring device configured to receive measurement information from the DC bus sensor, the input sensor, and the output sensor, to calculate a scaling factor using the received measurement from the DC bus sensor, to scale one of the measurement from the input sensor and the measurement from the output sensor using the scaling factor, and to determine the existence of a fault condition within the AC/AC converter using an evaluation of the scaled measurement relative to the unscaled measurement, wherein the monitoring device is structured to transmit an interrupt signal to a protective device in response to determining the existence of a fault condition, the interrupt signal structured to instruct the protective device to interrupt the flow of AC power received with the AC/AC converter.

2. The system of claim 1 wherein the input sensor measures the current of the AC power received by the AC/AC converter, the output sensor measures the active component of the AC power provided by the AC/AC converter, and the DC bus sensor measures the voltage across the DC bus.

3. The system of claim 2 wherein the monitoring device is configured to detect a fault by scaling one of the output sensor measurements and the input sensor measurements and comparing the scaled one of the output sensor measurements and the input sensor measurements with other of the output sensor measurements and the input sensor measurements.

4. The system of claim 2 wherein the magnitude of the scaling is determined using the DC bus sensor measurement.

5. The system of claim 3 wherein the AC/AC converter monitoring device is configured to detect a fault condition comprising one or more of a current imbalance, a short circuited subcomponent of the AC/AC converter, and an open circuit failure of a subcomponent of the AC/AC converter.

6. The system of claim 1 wherein the AC/AC converter is a variable speed drive including a transformer.

7. The system of claim 6 wherein the system comprises an electric motor having a plurality of stator windings coupled at a neutral point connection and the output sensor is structured to measure electric characteristics at the point of the neutral point connection.

8. A monitoring system coupled to a power system including a protected device configured to receive AC power, convert the received AC power to DC power, convert the DC power to AC power, and output the converted AC power, the monitoring system comprising:
- a first sensor configured to measure the AC power received by the protected device;
- a second sensor configured to measure the AC power output by the protected device;
- a third sensor configured to measure the DC power;
- a monitoring device structured to receive measurements from the first sensor, the second sensor, and the third sensor, and configured to calculate a scaling factor using one of the measurements of the third sensor and determine whether a fault is occurring within the protected device using an evaluation of one of the measurements from the first sensor relative to one of the measurements of the second sensor, in combination with the scaling factor; and
- a protective device structured to interrupt the flow of AC power to the protected device in response to determining a fault is occurring using the measurements from the first sensor, second sensor, and third sensor.

9. The monitoring system of claim 8 wherein the AC power received with the protected device is multiphase AC power.

10. The monitoring system of claim 9 wherein the first sensor is configured to measure multiphase current of the AC power received with the protected device, the second sensor is configured to measure multiphase current of the AC power output by the protected device, and the third sensor is structured to measure the voltage of the DC power.

11. The monitoring system of claim 10 wherein the monitoring device is configured to determine a fault is occurring within the protected device by scaling one of the measurements of the first sensor and the measurements of the second sensor and comparing the scaled measurements of the first or second sensor with the measurements of the other sensor.

12. The monitoring system of claim 9 wherein the fault is one of a current imbalance, a short circuit condition within the protected device, a ground fault, a motor ride through condition, and an open circuit condition within the protected device.

13. The monitoring system of claim 8 wherein the monitoring device is configured to transmit an alert message to a communication network in response to determining a fault is occurring using the measurements from the first sensor, second sensor, and third sensor.

14. A method for protecting a device including a converter structured to receive AC power, convert the AC power to DC power, convert the DC power to AC power, and output the converted AC power, the method comprising:
- measuring the AC power received with the device;
- measuring the DC power;
- measuring the AC power output with the device;
- calculating a scaling factor using the DC power measurement;
- scaling, using the scaling factor, either the measurement of AC power received with the device or the measurement of AC power output with the device;
- comparing the scaled one of the measurements of AC power received with the device and one of the measurements of AC power output with the device relative to the other unscaled one of the measurements of AC power received with the device and one of the measurement of AC power output with the device;
- determining a fault condition is occurring within the device in response to comparing the measurement of AC power received with the device and the measurement of AC power output with the device; and
- interrupting the flow of AC power to the device in response to determining a fault condition is occurring within the device.

15. The method of claim 14 wherein the AC power received with the device and the AC power output with the device is multiphase AC power, and comparing the measurement of AC power received with the device and the measurement of AC power output with the device including calculating the difference between the scaled measurement and the other measurement for each phase.

16. The method of claim 14 wherein the device is a variable speed drive including a transformer and a converter.

17. The method of claim 16 wherein a fault condition includes a transformer phase failure or a passive rectifier short circuit condition.

* * * * *